United States Patent
Wei et al.

(10) Patent No.: US 11,380,732 B2
(45) Date of Patent: Jul. 5, 2022

(54) MEMORY WITH OPTIMIZED RESISTIVE LAYERS

(71) Applicant: Micron Technology, Inc., Boise, ID (US)

(72) Inventors: Lei Wei, Boise, ID (US); Pengyuan Zheng, Boise, ID (US); Kevin Lee Baker, Boise, ID (US); Efe Sinan Ege, Boise, ID (US); Adam Thomas Barton, Boise, ID (US); Rajasekhar Venigalla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/941,885

(22) Filed: Jul. 29, 2020

(65) Prior Publication Data
US 2022/0037403 A1     Feb. 3, 2022

(51) Int. Cl.
*H01L 27/24*     (2006.01)
*H01L 45/00*     (2006.01)

(52) U.S. Cl.
CPC .......... *H01L 27/2481* (2013.01); *H01L 45/06* (2013.01); *H01L 45/1233* (2013.01); *H01L 45/1253* (2013.01); *H01L 45/1293* (2013.01); *H01L 45/1675* (2013.01)

(58) Field of Classification Search
CPC .................................................. H01L 45/1683
See application file for complete search history.

(56) References Cited

U.S. PATENT DOCUMENTS

| | | | |
|---|---|---|---|
| 2006/0113547 A1* | 6/2006 | Shin ................... | H01L 27/11526 257/77 |
| 2017/0117327 A1* | 4/2017 | Terai .................. | H01L 45/16 |
| 2019/0043924 A1 | 2/2019 | Conti et al. | |
| 2019/0333985 A1* | 10/2019 | Lee .................... | H01L 27/10811 |
| 2019/0362786 A1 | 11/2019 | Sugimae et al. | |
| 2020/0227480 A1 | 7/2020 | Konno | |

FOREIGN PATENT DOCUMENTS

| | | |
|---|---|---|
| CN | 111354761 A | 6/2020 |
| TW | 201834289 A | 9/2018 |

OTHER PUBLICATIONS

Taiwanese Patent Office, "Office Action", issued in connection with Taiwanese Patent Application No. 110127657 dated Apr. 6, 2022 (20 pages).

* cited by examiner

*Primary Examiner* — Mounir S Amer
(74) *Attorney, Agent, or Firm* — Holland & Hart LLP

(57) ABSTRACT

A memory system may include separate amounts or types of resistive material that may be deposited over memory cells and conductive vias using separate resistive layers in the access lines. A first resistive material layer may be deposited over the memory cells prior to performing an array termination etch used to deposit the conductive via. The array termination etch may remove the first resistive material over the portion of the array used to deposit the conductive via. A second resistive material layer may be deposited after the etch has occurred and the conductive via has been formed. The second resistive material layer may be deposited over the conductive via.

20 Claims, 10 Drawing Sheets

MEMORY WITH OPTIMIZED RESISTIVE LAYERS

BACKGROUND

The following relates generally to one or more systems for memory and more specifically to memory with optimized resistive layers.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

In the appended figures, similar components or features may have the same reference label. Further, various components of the same type may be distinguished by following the reference label by a dash and a second label that distinguishes among the similar components (e.g., "100-*a*"). If just the first reference label is used in the specification (e.g., "100"), the description is applicable to any one of the similar components having the same first reference label irrespective of the second reference label

DETAILED DESCRIPTION

In some cases, a resistive material may be used to control current stresses to memory cells. For example, a resistive material may be present between an access line driver for an access line and a memory stack containing a memory cell coupled with the access line to protect against high current stresses and spikes. In some cases, depositing resistive material between the access line and the memory stack may also deposit the resistive material between the access line driver and the access line (e.g., over a via for the access line). Too much resistive material, however, may reduce efficiency or performance of the access lines or memory cells. So a different amount of resistive material may be desired for each. But an optimal amount of resistive material for the access lines may be different than for the memory cells.

To allow for an independent optimization of resistive material provided for memory cells and access lines, separate amounts or types of resistive material may be deposited over the memory cells and the conductive vias using separate resistive layers in the access lines. This may allow an optimized amount of resistive material to be used for the memory cells and the access lines even when those amounts may be different for each.

A first resistive material layer may be deposited prior to performing an array termination etch used to deposit the conductive via. By doing this, the array termination etch may remove the first resistive material over a portion of the array used to deposit the conductive via. A second resistive material layer may be deposited after the etch has occurred and the conductive via has been formed. This allows the second resistive material layer to be deposited over the conductive via. So in the finished memory device, the first resistive material layer may be positioned between the memory cells and the conductive material in the access lines and the second resistive material layer may be positioned between the conductive vias and the conductive material in the access lines. As a result, the first resistive material layer may be designed to provide an optimized or desired amount of resistive material for the memory cells and the second resistive material layer may be designed to provide an optimized or desired amount of resistive material for the conductive vias, even when those amounts may be different from each other.

Features of the disclosure are initially described in the context of memory devices as described with reference to FIGS. 1 and 2. Features of the disclosure are described in the context of a manufacturing process as described with reference to FIGS. 3-5. Features of the disclosure are described in the context of a memory array as described with reference to FIG. 6. These and other features of the disclosure are further illustrated by and described with reference to a flowchart that relates to memory with optimized resistive layers as described with references to FIG. 7.

Figure 1:
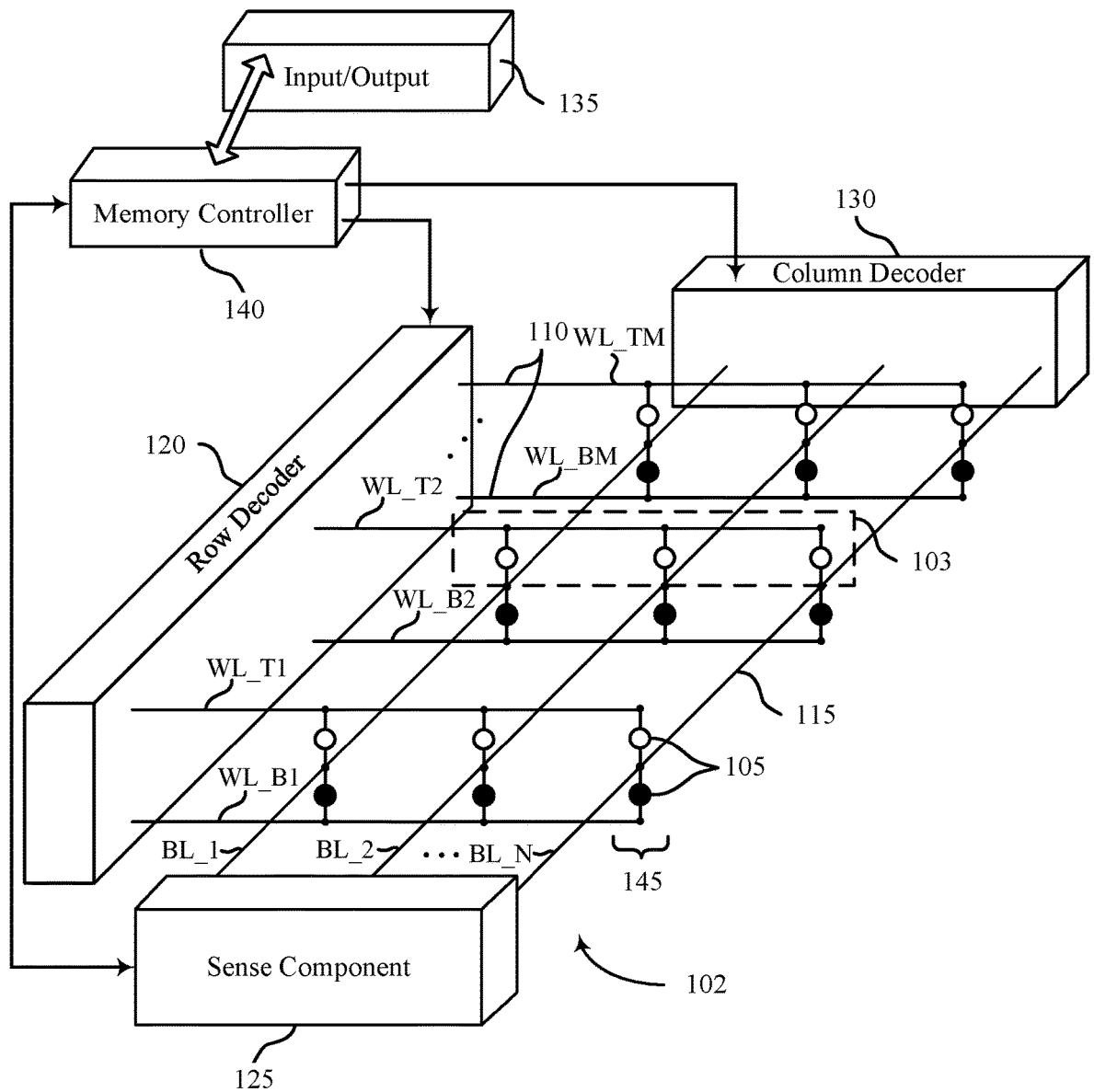
FIG. 1 illustrates an example of a system that supports memory with optimized resistive layers in accordance with examples as disclosed herein.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100. In the illustrative example of FIG. 1, the memory device 100 includes a 3D memory array 102. The memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The memory array 102 may include two or more two-dimensional (2D) memory arrays 103 formed on top of one another. This may increase a quantity of memory cells that may be placed or created on a single die or substrate as compared with 2D arrays, which in turn may reduce production costs (e.g., cost per bit), or increase the performance of the memory device, or both. The memory array 102 may include two levels of memory cells 105 and may thus be considered a 3D memory array; however, the quantity of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing a word line or a bit line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized (may have a voltage potential or current flow) to read or write a memory cell 105 at their intersection. Other memory cells 105 that are in electronic communication with (e.g., connected to) the same access line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different materials.

Operations such as reading and writing may be performed on memory cells 105 by activating or selecting access line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors (e.g., polysilicon), or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110 for the top array, labeled WL_T1 through WL_TM, multiple word lines 110 for the bottom array, labeled WL-B1 through WL_BM, and multiple digit lines 115, labeled BL_1 through BL_N, where M and N depend on the array size. Thus, by activating a word line 110 and a bit line 115, e.g., WL_T2 and BL_3, the memory cell 105 at their intersection may be accessed. As discussed below in more detail, accessing memory cells 105 may be controlled through a row decoder 120 and a column decoder 130 that may include one or more doped materials (e.g., forming transistors) within or on a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected or a threshold or limit voltage is applied. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the memory cell for achieving the results described herein. This example of a mechanism should not be considered limiting. This disclosure also includes other examples of mechanisms of the memory cell for achieving the results described herein.

Sense component 125 may include various transistors or amplifiers to detect and amplify a difference in the signals, which may be referred to as sensing or latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component 125 may be associated either with column decoder 130 or row decoder 120.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying a first voltage to the memory cell 105 as part of the access operation based on coupling the first conductive line of the decoder (e.g., row decoder 120 or column decoder 130) with the access line (e.g., word line 110 or bit line 115).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with a word line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. In some cases, the second voltage may cause the doped material to selectively couple the first conductive line of the decoder with the access line associated with the memory cell 105. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may be configured to store a logic state in the memory cell 105 based on applying the first voltage to the memory cell 105. Although discussed as applied by using a first voltage and a second voltage, it should be understood that current may be applied between the first conductive line and second conductive line to perform the access operation, in some cases.

In some examples, each word line 110 and/or each bit line 115 may be coupled with a conductive via that couples the word line 110 and/or bit line 115 with a substrate upon which the memory device 100 rests. Generally, the conductive via may be formed by etching out a portion of the memory array 102 to form a gap and depositing the conductive via material in the gap. However, methods of etching out the portion of the memory array 102 may damage memory cells 105 outside of the intended coverage of the gap, which may be referred to as tile or block damage. Methods of preventing tile or block damage may be described herein. In addition, methods of processing the memory array and conductive vias to manage resistance to word lines and/or bit lines are described herein.

Figure 2:
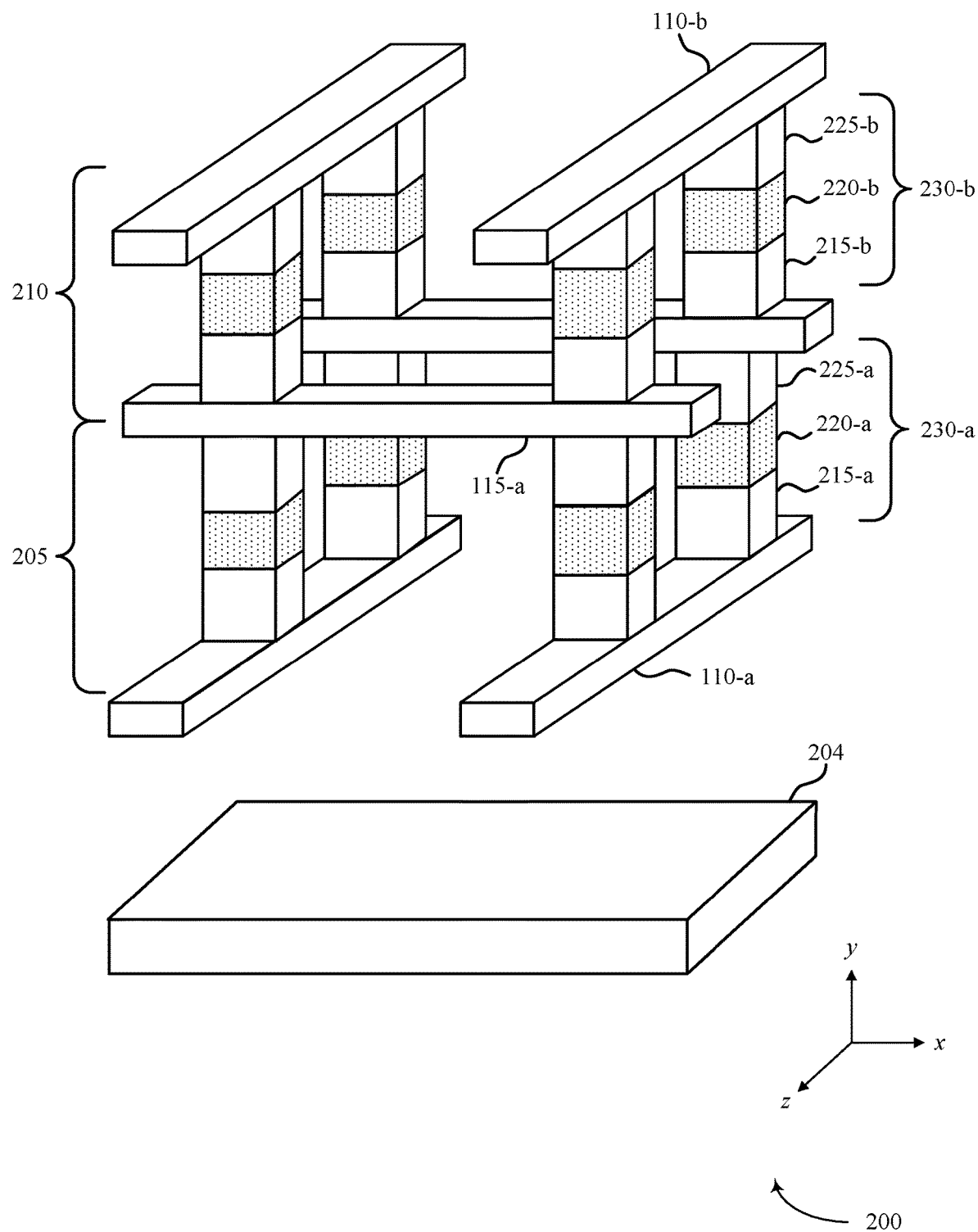
FIG. 2 illustrates an example of a memory array that supports memory with optimized resistive layers in accordance with examples as disclosed herein.

FIG. 2 illustrates an example of a memory device 200 that supports a memory with optimized resistive layers in accordance with examples as disclosed herein. Memory device 200 may be an example of portions of memory array 102 described with reference to FIG. 1. Memory device 200 may include a first array or deck 205 of memory cells that is positioned above a substrate 204 and second array or deck 210 of memory cells on top of the first array or deck 205. Memory device 200 may also include word line 110-*a*, word line 110-*b*, and bit line 115-*a*, which may be examples of word line 110 and bit line 115, as described with reference to FIG. 1. The first deck 205 and the second deck 210 each may have one or more memory cells (e.g., memory cell 220-*a* and memory cell 220-*b*, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may each include a first electrode 215-*a*, a memory cell 220-*a* (e.g., including chalcogenide material), and a second electrode 225-*a*. Memory cells of the second deck 210 may each include a first electrode 215-*b*, a memory cell 220-*b* (e.g., including chalcogenide material), and a second electrode 225-*b*. First electrode 215-*a*, memory cell 220-*a*, and second electrode 225-*a* may form a first memory stack 230-*a* and first electrode 215-*b*, memory cell 220-*b*, and second electrode 225-*b* may form a second memory stack 230-*b*. The memory stacks may also include other layers and materials. The memory cells of the first deck 205 and second deck 210 may, in some examples, have common conductive lines, such that corresponding memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent memory cells. In accordance with the teachings herein, a decoder may be coupled with each deck if the memory device 200 includes more than one deck. For example, a decoder may be coupled with first deck 205 and second deck 210. In some cases, the memory cells 220 may be examples of phase-change memory cells or self-selecting memory cells.

The architecture of memory device 200 may be referred to as a cross-point architecture, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture. In some cases, a cross-point architecture may be formed by two consecutive etches or cuts with patterns along orthogonal directions.

While the example of FIG. 2 shows two memory decks, other configurations are possible. In some examples, a single memory deck of memory cells may be constructed above a substrate 204, which may be referred to as a two-dimensional memory. In some examples, three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some examples, a chalcogenide material having primarily Se, As, and Ge may be referred to as SAG-alloy. In some examples, SAG-alloy may include Si and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a memory cell 220 including a chalcogenide material may be programmed to a logic state by applying a first voltage or a first current. By way of example, when a particular memory cell 220 is programmed, elements within the cell may separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

For example, if a memory cell has a given distribution of ions, the threshold voltage detected during the read operation may be different for a first read voltage with a first polarity than it is with a second read voltage having a second polarity. Depending on the polarity of the memory cell, this concentration of migrating ions may represent a logic "1" or logic "0" state. This description of ion migration represents an example of a mechanism of the memory cell for achieving the results described herein. This example of a mechanism should not be considered limiting. This disclosure is also applicable to other examples of mechanisms of the memory cell for achieving the results described herein.

In some cases, a first voltage may be applied to a first conductive line of a decoder as part of an access operation of the memory cell 220. Upon applying the first voltage, the first conductive line may be coupled with the access line (e.g., word line 110-a, word line 110-b, or bit line 115-a) associated with the memory cell 220. For example, the first conductive line may be coupled with the access line based on a doped material of the decoder which extends between the first conductive line and the access line in a first direction.

In some examples, the first voltage may be applied to the memory cell 220 based on coupling the first conductive line of the decoder with the access line. The decoder may include one or more transistors selectively coupling the first conductive line and the access line of the memory device 200. In some cases, the decoder may be formed in the substrate 204.

In some examples, a resistive material may be present in between an electrode and an access line. For instance, a resistive barrier may be present in between electrode 215-a and word line 110-a; between electrode 225-a and bit line 115-a; between electrode 215-b and bit line 115-a; between electrode 225-b and word line 110-b; or a combination of these locations. The resistive material may be configured to protect against current surges or reduce diffusion of heat between a memory cell 220 and a word line 110 or a bit line 115.

In some examples, a word line 110 and/or a bit line 115 may be coupled with a conductive via that couples the word line 110 and/or the bit line 115 with the substrate 204. In some cases, a conductive via may be coupled with word lines 110 or bit lines 115 from different decks. For instance, in the present example, a conductive via may be coupled with word line 110-a in deck 205 and word line 110-b in deck 210. According to techniques described herein, the resistive material may be formed between the electrode material and a word line or a bit line without also being between the conductive via and the word line or bit line.

FIGS. 3A through 5F illustrate manufacturing processes that include performing a series of operations on a layered assembly of materials to form a memory array including a conductive via that may allow an optimized or desired amount of resistive material to be used for memory cells and access lines even when those amounts may be different from each other.

These figures illustrate examples of intermediate structures that may be formed by performing operations of the manufacturing processes on a layered assembly of materials. The structures illustrated in FIGS. 3A through 3C may represent initial or partial processing steps on the layered assembly. The structures illustrated in FIGS. 4A through 4D may represent a first set of processing steps performed after the initial processing steps and the structures illustrated in FIGS. 5A through 5F may represent a second set of processing steps performed after the initial processing steps. Together, FIGS. 3A through 3C and 4A through 4D may represent a first manufacturing process and FIGS. 3A through 3C, and 5A through 5F may represent a second manufacturing process. In some cases, the first or second manufacturing processes may include combining various operations, altering the sequence of operations, eliminating one or more steps of these operations, or any combination thereof.

Figure 3A:
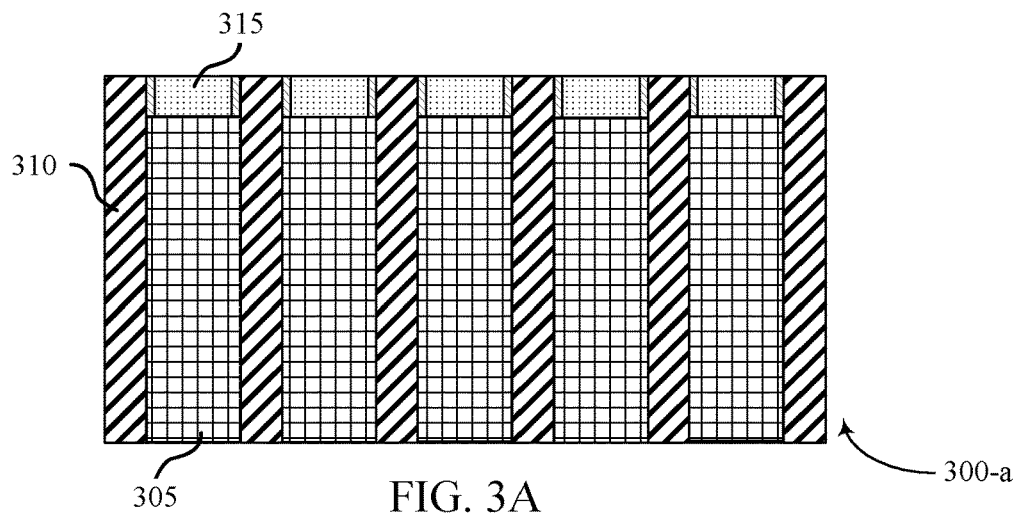
FIGS. 3A through 5F illustrate examples of operations performed as part of manufacturing processes that support memory with optimized resistive layers in accordance with examples as disclosed herein.
Figure 3B:
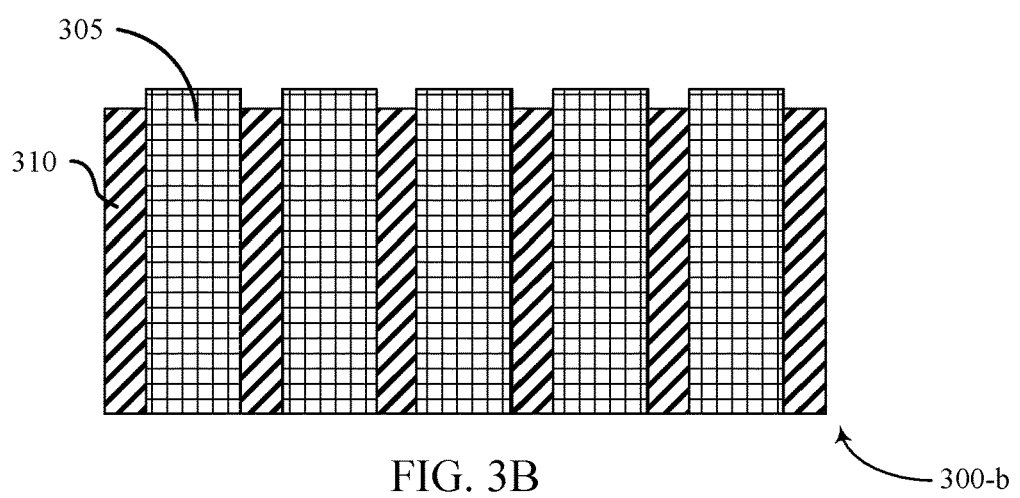
Figure 3C:
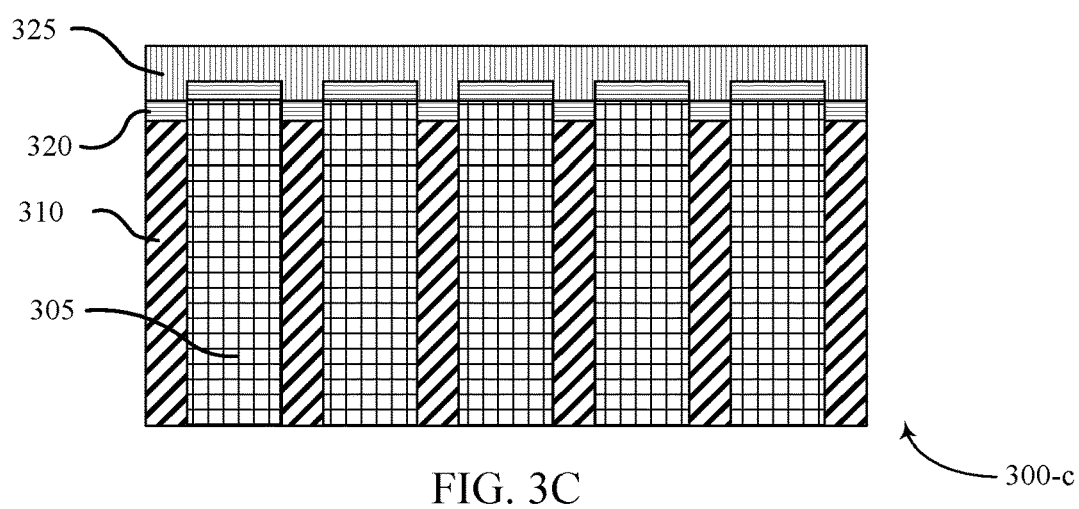

FIGS. 3A through 3C respectively illustrate cross-sectional views of layered assemblies of materials 300-a through 300-c that support memory with optimized resistive layers in accordance with examples as disclosed herein.

In FIG. 3A, memory stacks 305 may be separated from each other by dielectric material 310. Memory stack 305 may be composed of electrode materials (e.g., electrodes 215 and 225 as described with reference to FIG. 2) and memory materials (e.g., memory cell 220 as described with reference to FIG. 2). Dielectric materials 310 may be configured to provide structure while limiting an amount of charge that may be transferred between memory stacks 305.

In some cases, the arrangement of materials on each memory stack 305 may be the same for each memory stack 305. For instance, if a first memory stack 305 has a bottom electrode material, a memory material above the bottom electrode material, and a top electrode material above the memory material, a second adjacent memory stack may have a corresponding bottom electrode material, a corresponding memory material, and a corresponding top electrode material. The set of materials that correspond to each other among memory stacks 305 may be considered a patterned layer. For instance, the set of bottom electrodes may be considered a first patterned layer; the set of memory materials may be considered a second patterned layer; and the set of top electrodes may be considered a third patterned layer. The individual materials of memory stack 305 are not illustrated in FIGS. 3A to 5F for the sake of clarity. Additionally, the memory stacks 305 may be in contact with a bottom conductor, which may, for example, be the word lines 110 and/or the bit lines 115 as shown in FIG. 2.

Additionally, a hard mask (HM) 315 may be used for patterning at least part of memory stacks 305, and after a first planarization step (e.g., via chemical mechanical planarization (CMP)) may be approximately at a level of the dielectric material 310 between memory stacks 305. In some cases, HMs 315 may be composed of a nitride material.

In FIG. 3B, a manufacturing system may perform another processing step to etch HMs 315 (e.g., a second CMP step) and at least a portion of dielectric materials 310 away, which may expose the tops of the memory stacks 305. The dielectric material 310 may have a higher rate of material removal than the HM 315 and memory stack 305, and may have a smaller height than the memory stacks 305 after the processing step to etch HMs 315. In some cases, the termination process to remove the HMs 315 may be a wet process that does not result in substantial socket dishing.

In FIG. 3C, a manufacturing system may deposit a resistive material 320 onto the memory stacks 305 and the dielectric materials 310. The resistive material 320 may also be referred to as a thermal barrier material. The manufacturing system may deposit the resistive material 320 such that the exposed tops and the exposed sides of the memory stacks 305 are fully covered. In some cases, resistive material 320 may be composed of tungsten silicon nitride (WSiN) or silicon carbide (SiC) or a combination thereof. In some cases, resistive material 320 may be composed of aluminum oxide (AlOx) or tungsten oxide (WOx) or a combination thereof. Other materials are also possible.

The manufacturing system may then deposit a conductive material 325 on top of the resistive material 320. The manufacturing system may deposit the conductive material 325 such that the conductive material 325 has a relatively uniform surface on the top, or may perform processing (e.g., CMP) to produce the relatively uniform surface. In such cases, the thickness of the conductive material 325 may vary depending on whether the conductive material is over a memory stack 305 or a dielectric material 310. In some cases, conductive material 325 may be composed of tungsten.

FIGS. 4A through 4D respectively illustrate cross-sectional views of layered assemblies of materials 400-a through 400-d that support memory with optimized resistive layers in accordance with examples as disclosed herein. In some cases, FIGS. 4A through 4D may represent steps undertaken after the steps represented by FIGS. 3A through 3C have taken place.

Figure 4A:
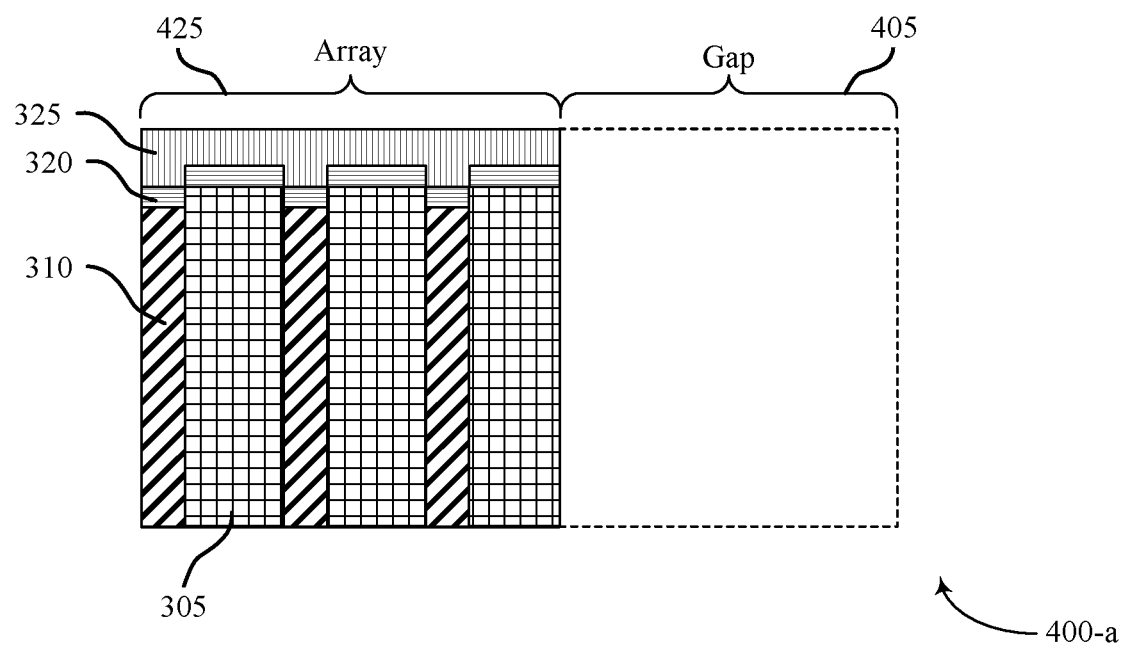

In FIG. 4A, a manufacturing system may etch at least some of the memory stacks 305 and the dielectric material 310 away at a first area of the layered assembly to form a gap 405. In the same processing step, the manufacturing system may etch at least a portion of the resistive material 320 and the conductive material 325. In some cases, the manufacturing system may etch one or multiple decks of memory stacks (e.g., the manufacturing system may etch one or more decks or all of the way to a substrate). FIG. 4A may illustrate the result of processing steps after FIG. 3C including deposition and patterning of a mask layer, and performing an etch with the patterned mask layer to remove the materials from the gap 405.

The presence of conductive material 325 may assist in preventing socket dishing at the interface between the array 425 and the gap 405. For example, where the conductive material 325 is not present when performing the etching, the etching may occur faster at the interface between the array 425 and the gap 405 due to increased CMP loading. Thus, the manufacturing process may cut into memory stacks 305 outside of the intended gap 405, which may be referred to as socket dishing. However, the planarization step to remove the mask over conductive material 325 may produce less socket dishing due to the different mask materials and increase in tolerance of the planarization (e.g., due to the thickness of the conductive material 325). The reduced socket dishing may reduce the possibility of damage impacting operation of the array or increase the number of layers that can be formed.

Figure 4B:
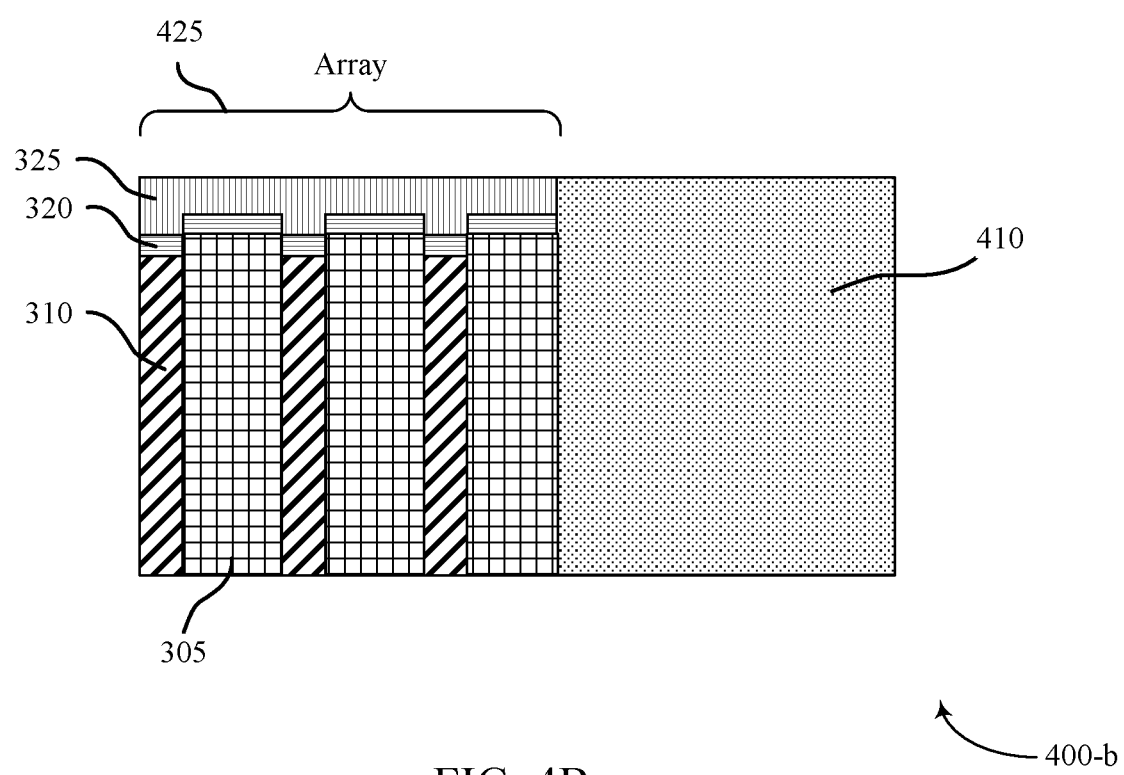

In FIG. 4B, the manufacturing system may deposit an insulator material 410 (e.g., tetraethyl orthosilicate (TEOS) or a dielectric material) in the gap 405. For example, from the assembly shown in FIG. 4A, deposition of the insulator material 410 may be followed by a planarization step (e.g., CMP) to remove the insulator material 410 over the array 425. The insulator material 410 may be configured to provide structure and insulate the memory stack 305. After the planarization, the insulator material 410 may have a top surface that is co-planar or substantially co-planar with the conductive material 325. In some cases, the conductive material 325 may serve to increase the tolerance of the planarization step where the resistive material 320 is deposited prior to the termination etch to create the gap 405. For example, the conductive material 325 may be substantially thicker than the resistive material 320. Without the conductive material 325 over the resistive material, stopping the planarization at or partially into the resistive material 320 may be challenging. For example, if the planarization step does not take off all of the insulator material 410 over the array 425, the conductivity through the resistive material may be compromised. Meanwhile, if the planarization step takes off excess amounts of the resistive material, the performance of the memory cells may be compromised. However, performing the planarization with the conductive material 325 may allow a greater tolerance for stopping the planarization within the thickness of the conductive material 325.

Figure 4C:
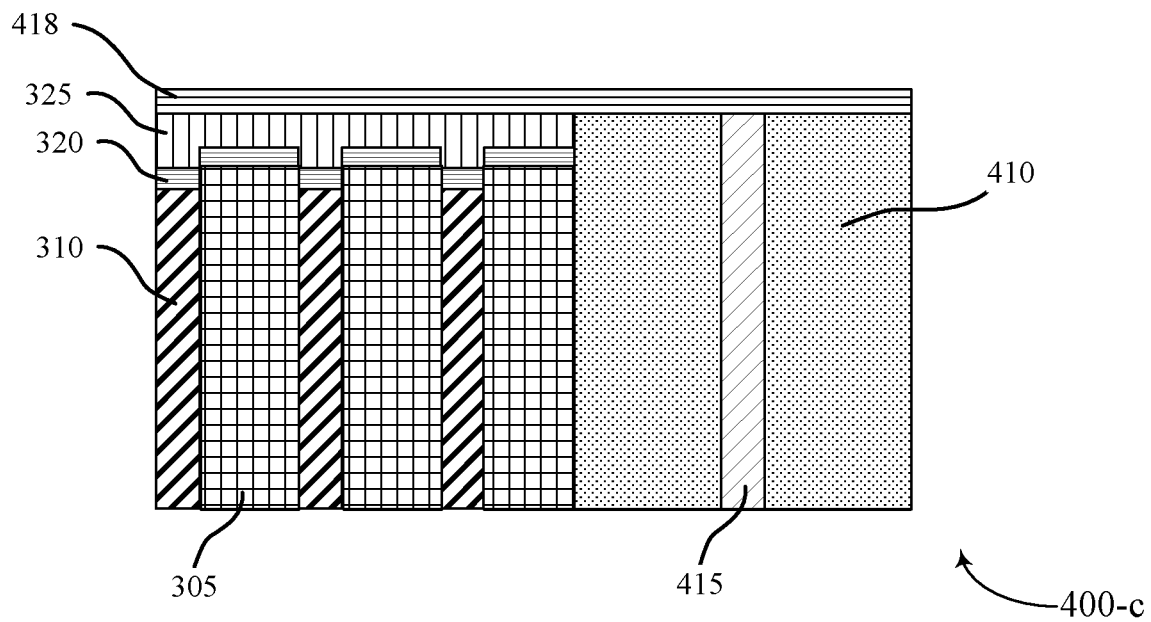

In FIG. 4C, the manufacturing system may etch the insulator material 410 to form a gap or hole (e.g., using one or more mask steps). The gap may extend through the insulator material 410 to, for example, a substrate below the insulator material 410. The manufacturing system may deposit a conductive via material 415 in the gap such that the via material 415 extends through the insulator material 410. The conductive via material 415 may have a surface in line with the insulator material 410. In some cases, the conductive via material 415 may extend to a height within the layered assembly that is above the resistive material 320.

After the via material has been deposited, the manufacturing system may deposit a resistive material 418 on the conductive material 325, the insulator material 410, and the conductive via material 415. In some cases, the resistive material 418 may be in direct contact with the conductive via material 415. The resistive material 418 may be composed of any of the materials discussed above with respect to resistive material 320. The resistivity of the resistive material layer 418 may be the same or different than the resistivity of the resistive material layer 320. As a result, the resistive material layer 418 may be designed to provide an optimized or desired amount of resistive material for the conductive vias, regardless of whether that amount may be different than the amount for the memory stack 305. In some cases, the resistivity of resistive material 320 may be greater than the resistivity of resistive material 418. The resistive material 418 may be the same thickness or a different thickness as resistive material 320. Resistive materials 320 and 418 may be composed of a same material or may be composed of different materials. In either case, resistive material 320 may be considered to be a first resistive material layer or first resistive material and resistive material 418 may be considered to be a second resistive material layer or second resistive material. In some cases, the manufacturing system may buff the conductive material 325 prior to deposition of the resistive material 418. Buffing may involve smoothing out the surface of the conductive material 325, and may assist in adherence of the resistive material 418.

Figure 4D:
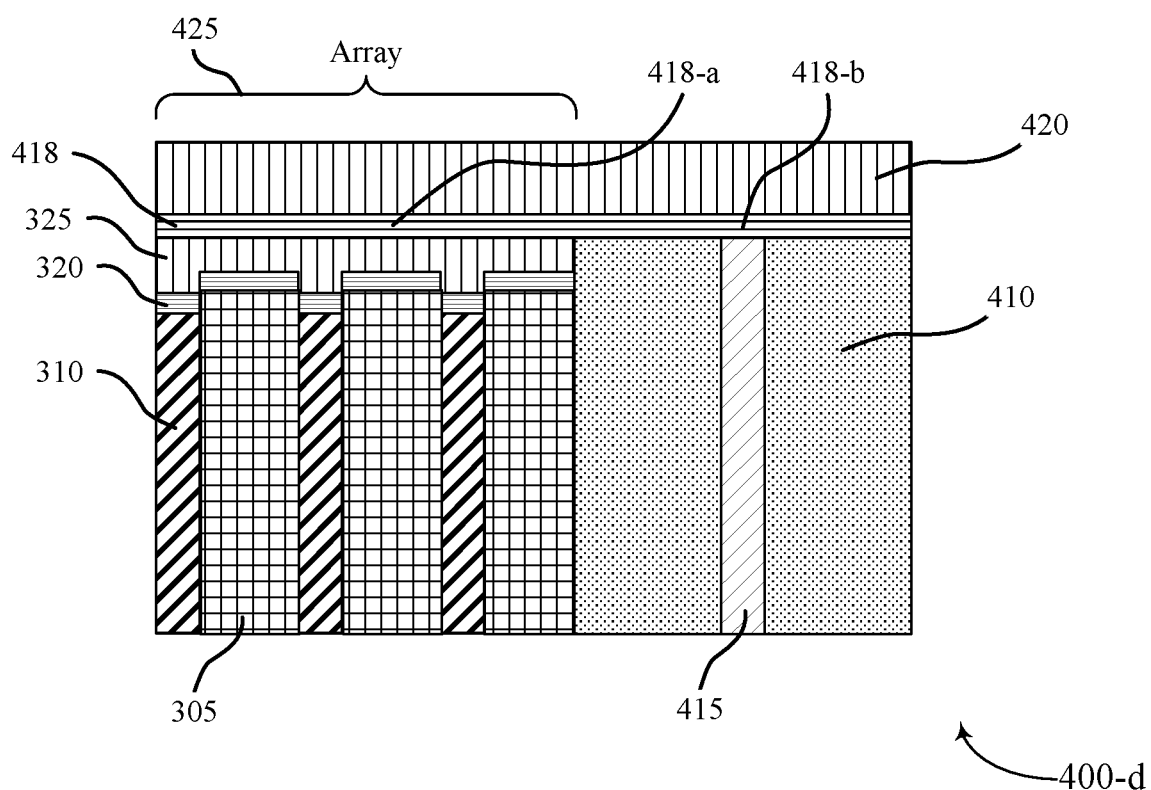

In FIG. 4D, the manufacturing system may deposit a conductive material 420 on the resistive material 418 to result in the memory device 400-d. The conductive materials 325 and 420 may be composed of a same material or may be composed of different materials. In either case, conductive material 325 may be considered to be a first conductive material layer or first conductive material and conductive material 420 may be considered to be a second conductive material layer or second conductive material. In some cases, conductive material 420 may be composed of tungsten. In some cases, the manufacturing system may buff the resistive material 418 prior to deposition of the conductive material 420. Buffing may involve smoothing out the surface of the resistive material 418, and may assist in adherence of the conductive material.

Although the thickness of resistive material 418 may be substantially the same over via 415 as over memory array 425, the surface area of the portion of resistive material 418 positioned over memory array 425 (portion 418-a) may be relatively larger than, and in some cases substantially larger than, the surface area of the portion of the resistive material 418 positioned over via 415 (portion 418-b). Because of this, the resistance provided by resistive material 418 may correspond to many equivalent resistances of portion 418-b in parallel. As a result, the total resistance provided by resistive material 418 between the substrate (e.g., access line driver) and memory stacks 305 may be dominated by the portion positioned over via 415 (e.g., portion 418-b).

Together, first resistive material 320, first conductive material 325, second resistive material 418 and second conductive material 420 may together form an access line (e.g., a word line 110 or a bit line 115). As shown, the first resistive material 320 may be positioned between the memory stack 305 and the conductive material 325 and 420 in the access line and the second resistive material 418 may be positioned between the conductive via 415 and the conductive material 420 in the access line. Using memory device 400-d, an independent optimization of resistive material may be provided for memory cells and access lines. Separate amounts or types of resistive material may be deposited over the memory cells and the conductive vias using separate resistive layers in the access lines. This may allow an optimized or desired amount of resistive material to be used for the memory cells and the access lines even when those amounts may be different from each other.

FIGS. 5A through 5F respectively illustrate cross-sectional views of layered assemblies of materials 500-a through 500-f that support memory with optimized resistive layers in accordance with examples as disclosed herein. In some cases, FIGS. 5A through 5F may represent steps undertaken after the steps represented by FIGS. 3A through 3C have taken place.

Figure 5A:
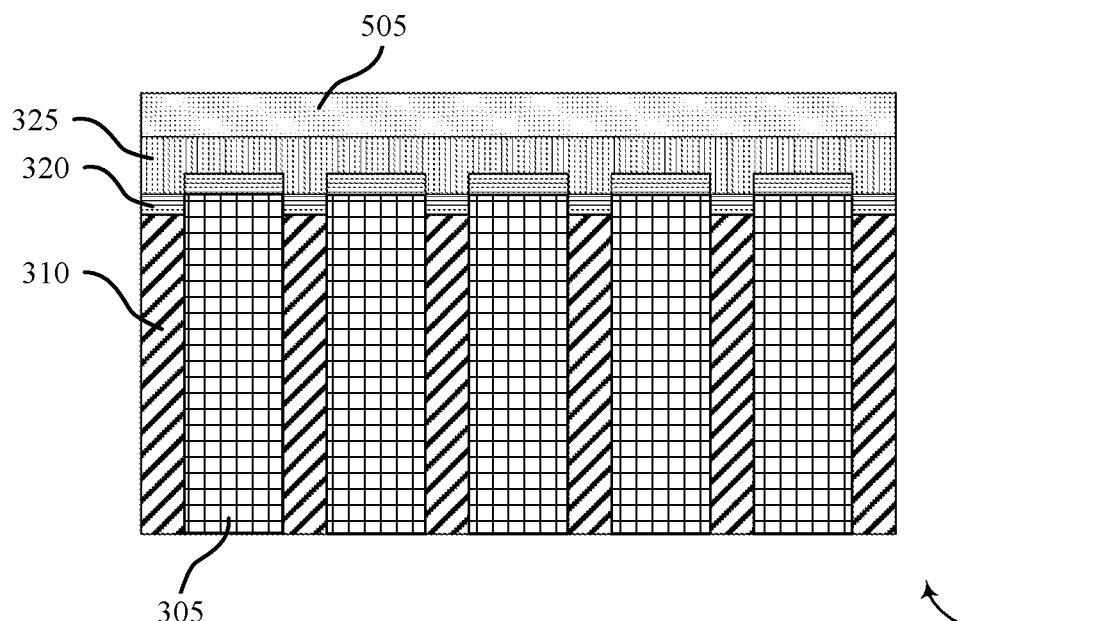

In FIG. 5A, the manufacturing system may deposit a cap material 505 over the conductive material 325. The cap material 505 may protect the resistive material 320, the conductive material 325, and the memory stacks 305 during processing. In some cases, the manufacturing system may buff the conductive material 325 prior to deposition of the cap material 505. Buffing may flatten the topography of the conductive material 325 and may enable the manufacturing system to deposit cap material 505 on a uniform surface.

Figure 5B:
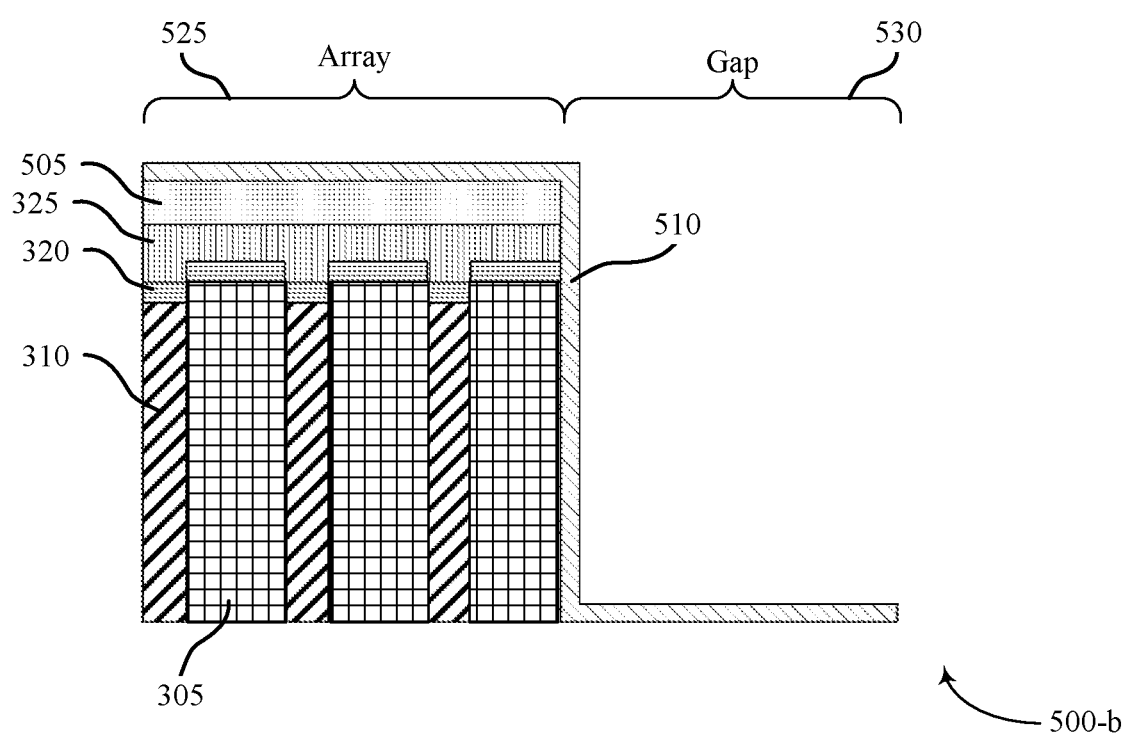

In FIG. 5B, the manufacturing system may etch at least some of the memory stacks 305 and the dielectric material 310 away at a first area of the layered assembly to form a gap 530. In the same processing step, the manufacturing system may etch at least a portion of the resistive material 320, the conductive material 325, and the cap material 505. Additionally, the manufacturing system may deposit a liner material 510 over the cap material 505 and in the gap 530. The liner material 510 may be deposited over the exposed portions of the gap 530, including the bottom (e.g., the substrate) and sides (e.g., the sidewall of the array 525). Thus, the liner material 510 may have a first horizontal portion over the cap material 505, a second horizontal portion over the gap 530, and a vertical portion in contact with ends of the cap material 505, the conductive material 325, and the resistive material 320, and a side of a memory stack 305 or dielectric 310. The vertical portion of the liner material 510 may protect an adjacent memory stack 305, the cap material 505, the conductive material 325, the resistive material 320 or a combination of these during additional processing or during operation (e.g., by additional insulative properties). The liner material 510 may, for example, have a higher dielectric constant than a dielectric material used to fill the gap 530.

The vertical portion of the liner material 510 may be in contact with a memory stack 305. In some cases, the vertical portion may adjoin the first and second horizontal portions. The liner material 510 may be composed of the same material as the cap material 505 or may be composed of a different material. For instance, both the cap material 505 and the liner material 510 may be composed of a nitride-like material. Alternatively the cap material 505 may be composed of a nitride material and the liner material 510 may be composed of a nitride-like material different from the cap material 505.

Figure 5C:
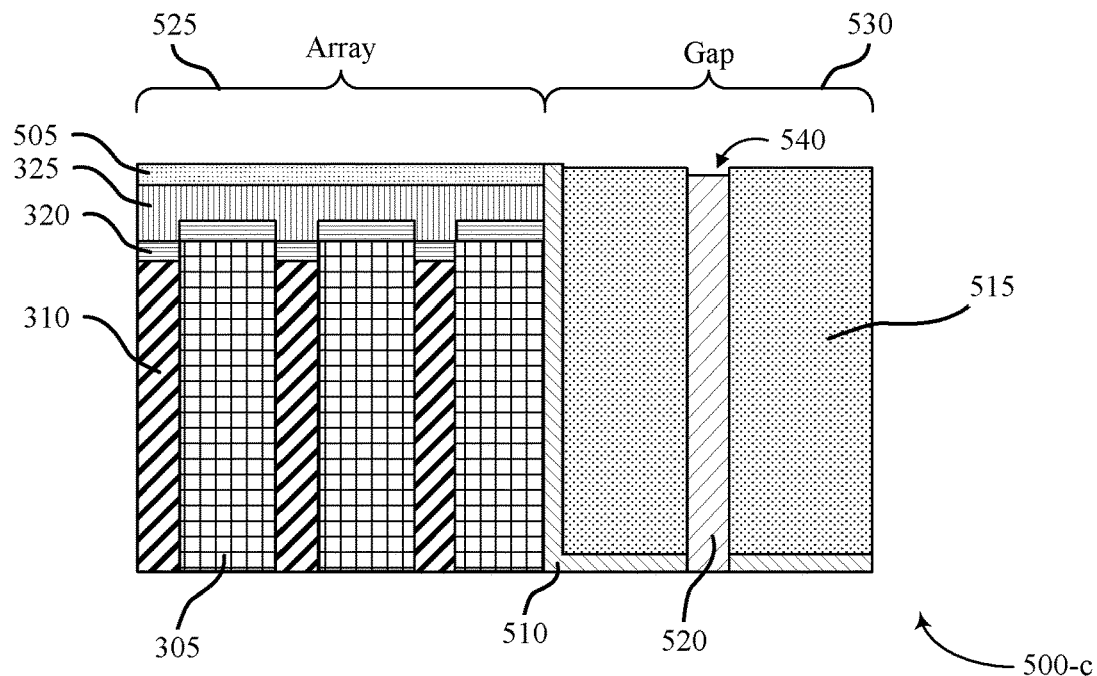

In FIG. 5C, the manufacturing system may fill the gap 530 with an insulator material 515 (e.g., TEOS or a dielectric material). A two-step planarization or removal process may be used to fill the gap 530 and planarize the assembly after deposition of insulator material 515. Initially, the insulator material 515 may be deposited over both the array 525 and gap 530 (not shown). A first planarization step may then be used to remove the dielectric over the array 525. The first planarization step may be designed to stop on the cap material 505. The first planarization step may use a first slurry (e.g., an oxide slurry). The first planarization step may result in the array and dielectric assembly shown in FIG. 5C. Thus, the insulator material 515 is shown over the second horizontal portion of the liner material 510 and filling the gap to approximately the height of the cap material 505 (or the portion of the cap material 505 that remains after the planarization step stops at the cap material 505). The liner material 510 may form a barrier between the insulator material 515 and the resistive material 320 and between the insulator material 515 and the conductive material 325.

After depositing the insulator material 515 and performing the first planarization process, the manufacturing system may etch the insulator material 515 and a portion of the liner material 510 to form a gap or hole 540. The manufacturing system may deposit a conductive via material 520 in the gap or hole 540 such that the via material 520 extends through the insulator material 515. In some cases, a top surface of the conductive via material 520 may be in line with insulator material 515. In some cases, the conductive via material 520 may extend to a height within the layered assembly that is above the resistive material.

Figure 5D:
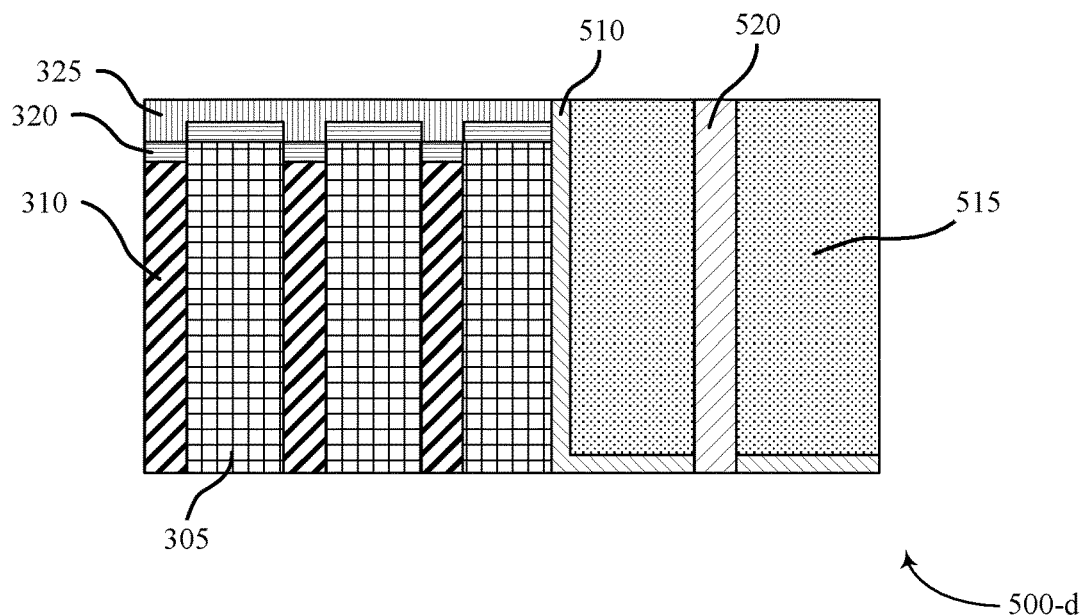

In FIG. 5D, the manufacturing system may use a second planarization step to remove the cap material 505 to result in layered assembly of materials 500-d. The second planarization step may use different processing features than the first planarization step (e.g., a second, different slurry than the first slurry). The second planarization process may be formulated to stop on the conductive material 325.

After the second planarization process is completed, a top surface of conductive material 325, a top surface of the vertical portion of the liner material 510, a top surface of insulator material 515, and a top surface of conductive via material 520 may be approximately co-planar with each other.

Figure 5E:
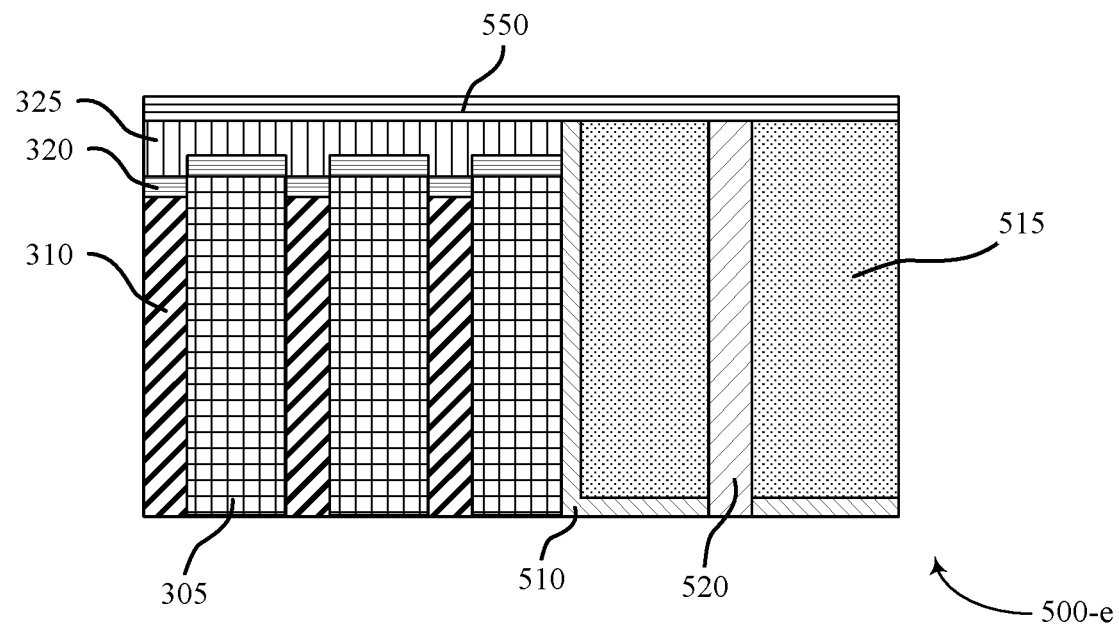

In FIG. 5E, the manufacturing system may deposit a resistive material 550 on top of the conductive material 325, the vertical portion of the liner material 510, the insulator material 515, and the conductive via material 520. In some cases, the resistive material 550 may be in direct contact with the conductive via material 520. The resistive material 550 may be composed of any of the materials discussed above with respect to resistive material 320. The resistivity of the resistive material layer 550 may be the same or different than the resistivity of the resistive material layer 320. As a result, the resistive material layer 550 may be designed to provide an optimized or desired amount of resistive material for the conductive vias, regardless of whether that amount may be different than the amount for the memory stack 305. In some cases, the resistivity of resistive material 320 may be greater than the resistivity of resistive material 550. The resistive material 550 may be the same thickness or a different thickness as resistive material 320. Resistive materials 320 and 550 may be composed of a same material or may be composed of different materials. In either case, resistive material 320 may be considered to be a first resistive material layer or first resistive material and resistive material 550 may be considered to be a second resistive material layer or second resistive material. In some cases, the manufacturing system may buff the conductive material 325 prior to deposition of the resistive material 550. Buffing may involve smoothing out the surface of the conductive material 325, and may assist in adherence of the resistive material 550.

Figure 5F:
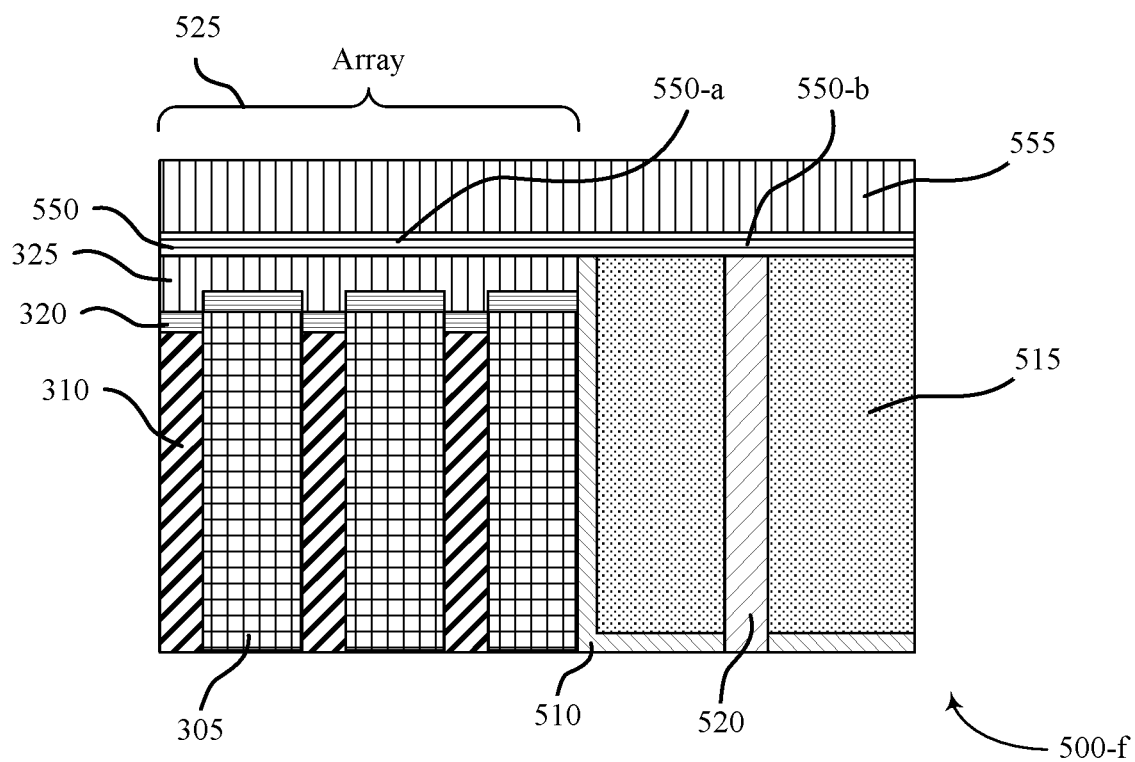

In FIG. 5F, the manufacturing system may deposit a conductive material 555 on the resistive material 550 to result in the memory device 500-f. The conductive materials 325 and 555 may be composed of a same material or may be composed of different materials. In either case, conductive material 325 may be considered to be a first conductive material layer or first conductive material and conductive material 555 may be considered to be a second conductive material layer or second conductive material. In some cases, conductive material 555 may be composed of tungsten. In some cases, the manufacturing system may buff the resistive material 550 prior to deposition of the conductive material 555. Buffing may involve smoothing out the surface of the resistive material 550, and may assist in adherence of the conductive material 555.

Although the thickness of resistive material 550 may be substantially the same over via 520 as over memory array 525, the surface area of the portion of resistive material 550 positioned over memory array 525 (portion 550-a) may be relatively larger than, and in some cases substantially larger than, the surface area of the portion of the resistive material 550 positioned over via 520 (portion 550-b). Because of this, the resistance provided by resistive material 550 may correspond to many equivalent resistances of portion 550-b in parallel. As a result, the total resistance provided by resistive material 550 between the substrate (e.g., access line driver) and memory stacks 305 may be dominated by the portion positioned over via 520 (e.g., portion 550-b).

Together, first resistive material 320, first conductive material 325, second resistive material 550 and second conductive material 555 may together form an access line (e.g., a word line 110 or a bit line 115). As shown, the first resistive material 320 may be positioned between the memory stack 305 and the conductive materials 325 and 555 in the access line and the second resistive material 550 may be positioned between the conductive via 520 and the conductive material 555 in the access line. Using memory device 500-f, an independent optimization of resistive material may be provided for memory cells and access lines. Separate amounts or types of resistive material may be deposited over the memory cells and the conductive vias using separate resistive layers in the access lines. This may allow an optimized or desired amount of resistive material to be used for the memory cells and the access lines even when those amounts may be different from each other Generally, the processes as described herein may enable a smaller die size, as the processes described herein may limit tile damage that occurs at smaller scales. Additionally or alternatively, the processes described herein may decrease a size of sockets or may prevent the formation of sockets completely, which may lower a chance that tile damage will occur. Additionally or alternatively, the processes described herein may provide fewer dummy line opportunities.

Figure 6:
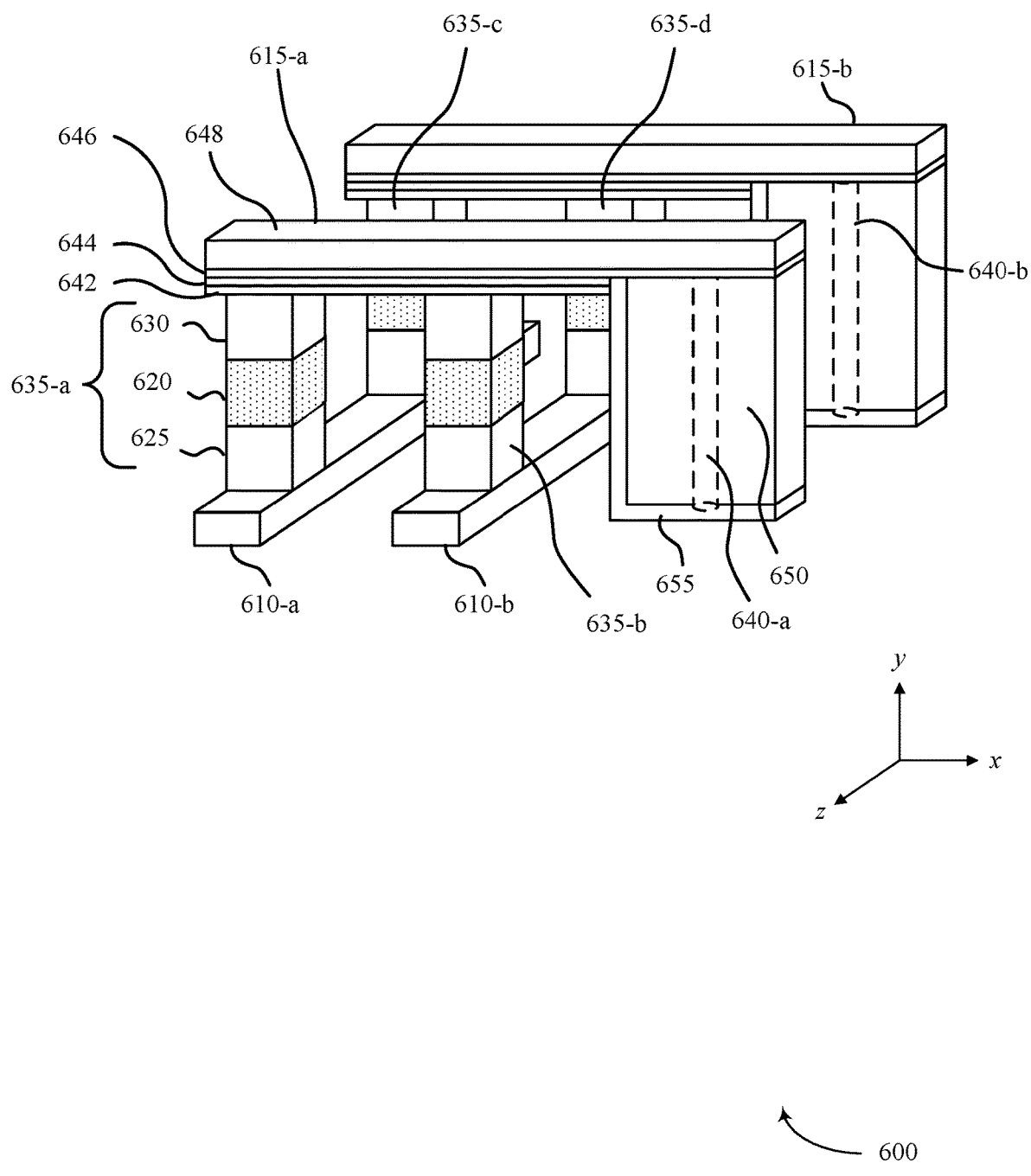
FIG. 6 illustrates an example of a memory device that supports memory with optimized resistive layers in accordance with examples as disclosed herein.

FIG. 6 illustrates an example of a memory device 600 that supports a memory with optimized resistive layers in accordance with examples as disclosed herein. Memory device 600 may be an example of portions of memory array 102 described with reference to FIG. 1 or memory device 200 described with reference to FIG. 2. Memory device 600 may include a plurality of first access lines 610 (e.g., word lines) extending in a first direction z. The word lines 610 may be examples of word lines 110, as described with reference to FIGS. 1 and 2.

Memory device 600 may also include an array of memory stacks 635 positioned on the word lines 610. Each word line 610 may have positioned thereon a respective plurality of the memory stacks 635 (e.g., memory stacks 635-a and 635-c on word line 610-a and memory stacks 635-b and 635-d on word line 610-b). The memory stacks 635 may be composed of memory cells 620 and electrodes 625 and 630. The memory stacks 635 may also include other layers and materials. Memory stacks 635 may be examples of memory stacks 230 as described with reference to FIG. 2. Memory stacks 635 may be separated from each other by dielectric material. The dielectric material between memory stacks 230 is not illustrated in FIG. 6 for the sake of clarity.

Memory device 600 may also include a plurality of conductive vias 640 that may be aligned with each other in the first direction z. Vias 640 may be examples of conductive vias 415 and 520 as described with reference to FIGS. 4C and 5C. Similar to those embodiments, each via 640 may comprise a conductive material and extend through an insulator material 650 deposited in a gap. Each via 640 may also extend through a liner material 655, that lines the gap, similar to via 520, discussed above. Each via 640 may be aligned in a second direction x with a group of the memory stacks 635. Each group of memory stacks may include a memory stack 635 positioned on each word line 610 (e.g., a group aligned with via 640-a may include memory stacks 635-a and 635-b).

Memory device 600 may include a plurality of second access lines 615 (e.g., bit lines) extending in the second direction x. The bit lines 615 may be examples of bit lines 115, as described with reference to FIGS. 1 and 2. Each bit line 615 may extend over a via 640 and the memory stacks 635 in the via's corresponding group (e.g., bit line 615-a may extend over via 640-a and memory stacks 635-a and 635-b).

Each bit line 615, and the via 640 and memory stacks 635 over which it extends, may incorporate memory device 400-d shown in FIG. 4D or the memory device 500-f shown in FIG. 5F and may be formed in the same manner. For example, memory device 600 is depicted as incorporating the memory device 500-f shown in FIG. 5F.

As in memory device 500-f, bit line 615-a may comprise, in order from bottom to top, a first resistive material 642, a first conductive material 644, a second resistive material 646, and a second conductive material 648. The first resistive material 642 and first conductive material 644 may extend over all the memory stacks 635 in the group (e.g., memory stacks 635-a and 635-b). The second resistive material 646 and second conductive material 648 may also extend over memory stacks 635-a and 635-b but may further extend over the corresponding via 640-a. As a result, the memory device 600 may be designed to provide an optimized or desired amount of second resistive material 646 for the conductive vias, regardless of whether that amount may be different than the amount for the memory stack 635. In addition, the first resistive material 642 may directly contact memory stacks 635-a and 635-b and the second resistive material 646 may directly contact the via 640-a. One end of the first resistive material 642 and first conductive material 644 may end at the liner material 655. As such, the liner material 655 may form a barrier between the insulator material 650 and the first resistive material 642 and between the insulator material 650 and the first conductive material 644.

In some embodiments, word lines 610 and bit lines 615 may be interchanged. In those embodiments, each via 640 and corresponding group of memory stacks 635 may be associated with a word line instead of a bit line. For example, word line 610 may instead be a bit line and bit line 615 may instead be a word line.

Figure 7:
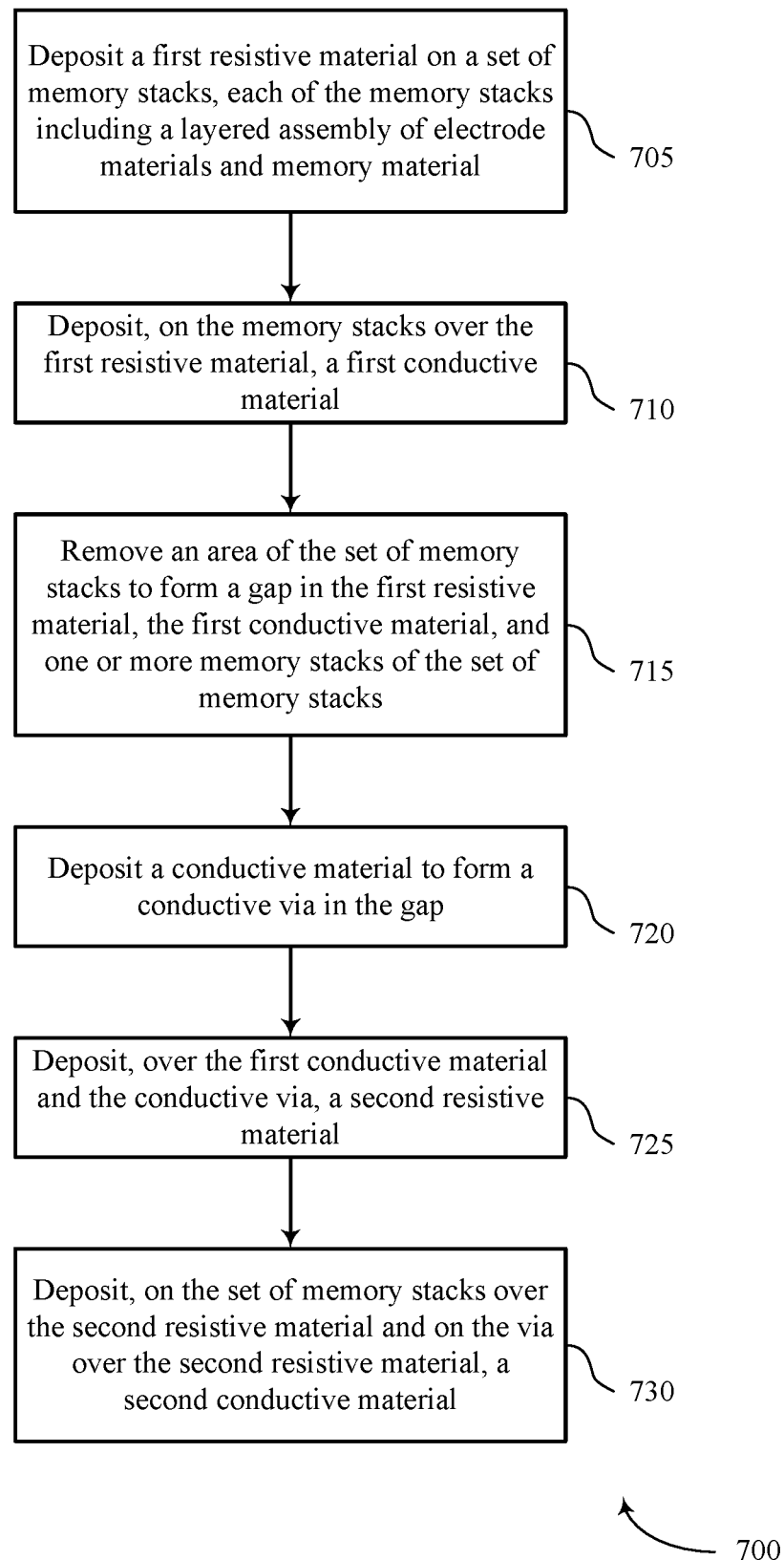
FIG. 7 shows a flowchart illustrating a method that supports memory with optimized resistive layers in accordance with examples as disclosed herein.

Using memory device 600, an independent optimization of resistive material may be provided for memory cells and access lines. Separate amounts or types of resistive material may be deposited over the memory cells and the conductive vias using separate resistive layers in the access lines. This may allow an optimized or desired amount of resistive material to be used for the memory cells and the access lines even when those amounts may be different for each FIG. 7 shows a flowchart illustrating a method 700 that supports memory with optimized resistive layers in accordance with aspects of the present disclosure. The operations of method 700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 705, the method 700 may include depositing a first resistive material on a set of memory stacks. Each of the memory stacks may include a layered assembly of electrode materials and memory material. The operations of 705 may be performed according to the methods described herein.

At 710, the method 700 may include depositing, on the memory stacks over the first resistive material, a first conductive material. The operations of 710 may be performed according to the methods described herein.

At 715, the method 700 may include removing an area of the set of memory stacks to form a gap in the first resistive material, the first conductive material, and one or more memory stacks of the set of memory stacks. In some cases, the gap may be formed by etching. The operations of 715 may be performed according to the methods described herein.

At 720, the method 700 may include depositing a conductive material to form a conductive via in the gap. In some cases, a dielectric material may be deposited in the gap and the conductive via may extend through the dielectric material. In some cases, a liner material may be deposited over the first conductive material and the gap before the conductive via is formed. The liner material may form a barrier between the gap and the first resistive material and between the gap and the first conductive material. In some cases, a first portion of the liner material may be removed before the second resistive material is deposited. The operations of 720 may be performed according to the methods described herein.

At 725, the method 700 may include depositing, over the first conductive material and the conductive via, a second resistive material. In some cases, the resistivity of the first resistive material is greater than the resistivity of the second resistive material. In some cases, the first resistive material and the second resistive material are comprised of the same material. The operations of 725 may be performed according to the methods described herein.

At 730, the method 700 may include depositing, on the set of memory stacks over the second resistive material and on the via over the second resistive material, a second conductive material. The operations of 730 may be performed according to the methods described herein.

It should be noted that the methods described above describe possible implementations, and that the operations and the steps may be rearranged or otherwise modified and that other implementations are possible. Furthermore, portions from two or more of the method steps may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive.

A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   a substrate;
   a plurality of memory stacks positioned on the substrate, each memory stack comprising a layered assembly of electrode materials and memory material;
   a first resistive material positioned directly on the plurality of memory stacks;
   a first conductive material positioned on the plurality of memory stacks over the first resistive material;
   a via positioned on the substrate, the via comprising a conductive material;
   a second resistive material positioned on the first conductive material and the via; and
   a second conductive material positioned on the second resistive material.

2. The memory device of claim 1, wherein a resistivity of the first resistive material is greater than a resistivity of the second resistive material.

3. The memory device of claim 1, further comprising a dielectric material positioned in a gap of the memory device, the via extending through the dielectric material.

4. The memory device of claim 3, further comprising a liner material positioned in the gap so as to form a barrier between the dielectric material and the first resistive material and between the dielectric material and the first conductive material.

5. The memory device of claim 1, wherein the first resistive material and the second resistive material are a same material.

6. The memory device of claim 1, wherein the first resistive material comprises WSiN or SiC.

7. A memory device, comprising:
   a substrate;
   a plurality of memory stacks positioned on the substrate, each memory stack comprising a layered assembly of electrode materials and memory material;
   a via positioned on the substrate, the via comprising a conductive material;
   a first resistive material positioned on the plurality of memory stacks, wherein the first resistive material covers the plurality of memory stacks and fails to cover the via;
   a first conductive material positioned on the plurality of memory stacks over the first resistive material;
   a second resistive material positioned on the first conductive material and the via; and
   a second conductive material positioned on the second resistive material.

8. The memory device of claim 7, wherein a resistivity of the first resistive material is greater than a resistivity of the second resistive material.

9. The memory device of claim 7, further comprising a dielectric material positioned in a gap of the memory device, the via extending through the dielectric material.

10. The memory device of claim 7, wherein the first resistive material and the second resistive material are a same material.

11. The memory device of claim 7, wherein the first resistive material comprises WSiN or SiC.

12. A memory device, comprising:
    a substrate;
    a plurality of memory stacks positioned on the substrate, each memory stack comprising a layered assembly of electrode materials and memory material;
    a via positioned on the substrate, the via comprising a conductive material;
    a first resistive material positioned on the plurality of memory stacks, wherein the first resistive material covers the plurality of memory stacks and fails to cover the via;
    a first conductive material positioned on the plurality of memory stacks over the first resistive material;
    a second resistive material positioned on the first conductive material and the via, wherein the conductive material of the via is in direct contact with the second resistive material; and
    a second conductive material positioned on the second resistive material.

13. A memory device, comprising:
a plurality of first access lines extending in a first direction;
respective pluralities of memory stacks on the plurality of first access lines;
a plurality of vias, each aligned in a second direction with a group of memory stacks, each group of memory stacks comprising a memory stack from each of the plurality of first access lines that are aligned in the second direction with the via, each via comprising a conductive material; and
a plurality of second access lines extending in the second direction, each second access line extending over a via of the plurality of vias and the group of memory stacks aligned with the via,
wherein each second access line comprises:
   a first resistive material positioned directly on each memory stack of the respective pluralities of memory stacks;
   a first conductive material positioned on the first resistive material;
   a second resistive material positioned on the via and the first conductive material; and
   a second conductive material positioned on the second resistive material.

14. The memory device of claim 13, wherein the first resistive material does not cover the plurality of vias.

15. The memory device of claim 13, wherein a resistivity of the first resistive material is greater than a resistivity of the second resistive material.

16. The memory device of claim 13, wherein each via extends through a dielectric material and a liner material that forms a barrier between the dielectric material and the first resistive material and between the dielectric material and the first conductive material.

17. A memory device, comprising:
a plurality of first access lines extending in a first direction;
respective pluralities of memory stacks on the plurality of first access lines;
a plurality of vias, each aligned in a second direction with a group of memory stacks, each group of memory stacks comprising a memory stack from each of the plurality of first access lines that are aligned in the second direction with the via, each via comprising a conductive material; and
a plurality of second access lines extending in the second direction, each second access line extending over a via of the plurality of vias and the group of memory stacks aligned with the via,
wherein each second access line comprises:
   a first resistive material positioned on each memory stack of the respective pluralities of memory stacks;
   a first conductive material positioned on the first resistive material;
   a second resistive material positioned on the via and the first conductive material, wherein the conductive material of each via is in direct contact with the second resistive material; and
   a second conductive material positioned on the second resistive material.

18. The memory device of claim 17, wherein the first resistive material does not cover the plurality of vias.

19. The memory device of claim 17, wherein a resistivity of the first resistive material is greater than a resistivity of the second resistive material.

20. The memory device of claim 17, wherein each via extends through a dielectric material and a liner material that forms a barrier between the dielectric material and the first resistive material and between the dielectric material and the first conductive material.

* * * * *